United States Patent [19]

Briese

[11] 4,136,297
[45] Jan. 23, 1979

[54] FOUR CORNER PIEZOELECTRIC CRYSTAL SUPPORT

[75] Inventor: Wolfgang Briese, Berlin, Germany

[73] Assignee: International Standard Electric Corporation, New York, N.Y.

[21] Appl. No.: 842,716

[22] Filed: Oct. 17, 1977

[30] Foreign Application Priority Data

Nov. 9, 1976 [DE] Fed. Rep. of Germany ....... 2651094

[51] Int. Cl.² ............................................ H01L 41/10
[52] U.S. Cl. ................................................... 310/353
[58] Field of Search ................................ 310/351–353

[56] References Cited

U.S. PATENT DOCUMENTS

| 2,471,625 | 5/1949 | Johnstone | 310/353 X |
| 2,820,911 | 1/1958 | Klingsporn | 310/353 X |

Primary Examiner—Mark O. Budd
Attorney, Agent, or Firm—John T. O'Halloran; Alfred C. Hill

[57] ABSTRACT

A piezoelectric crystal is held in the slots of two flat spring sheetmetal members with small flaps of the spring being bent out of the slots lying against the bevelled edges of the crystal to improve shock resistance. Additionally the flaps can be fastened to the crystal by using an elastic material.

7 Claims, 4 Drawing Figures

FOUR CORNER PIEZOELECTRIC CRYSTAL SUPPORT

BACKGROUND OF THE INVENTION

The present invention relates to a piezoelectric crystal holder in which a crystal vibrator coated with electrodes on both sides, is placed with its corners into the slots of two angled-off spring sheetmetal members.

Various arrangements of piezoelectric crystal elements in a holder are already known.

Thus, it is known from the German Printed Patent Application (DT-AS) No. 970 658 to mount a circular or square crystal vibrator in the slots of a strip of insulating material.

Moreover, from the Swiss Patent No. 443 418 it is known to support two circular piezoelectric crystal vibrators in the slots of straight spring sheetmetal strips.

In the type of embodiment according to the U.S. Pat. No. 2,850,651 a circular or square piezoelectric crystal vibrator is retained in the slots of two metal tapes which are provided with a bent portion within the range of the slots.

An arrangement similar to that of the aforementioned U.S. Pat. No. 2,850,651 is shown and described in the German Published Patent Application (DT-OS) No. 2,019,389.

In this arrangement the piezoelectric crystal vibrator is still secured within the range of the slots by using an electrically conductive bonding cement.

Finally, it has become known from the German Printed Patent Application (DT-AS) No. 2,364,817 to support a circular or square piezoelectric crystal vibrator with two bevelled corners in slotted and angled-off sheetmetal strips.

All of these conventional arrangements were aimed at providing the piezoelectric crystal vibrator with a holder for improving the insensitivity to shocks and vibrations of the arrangement.

In some cases of practical application, however, the insensitivity to shocks and vibrations of the conventional holders is still insufficient. Thus, for example, quartz resonators are used to an increasing extent as standard frequency generators with clocks, i.e. not only with stationary clocks, but also with smaller utility clocks and watches, such as wrist watches. Here, still higher requirements are placed on the insensitivity to shocks and vibrations, which cannot be met with the conventional arrangements.

SUMMARY OF THE INVENTION

It is the object of the present invention, therefore, to provide a piezoelectric crystal holder whose insensitivity to shocks and vibrations is suitable for meeting these increased requirements.

A feature of the present invention is the provision of a piezoelectric crystal holder for a rectangular crystal vibrator coated on both sides with electrodes comprising: the crystal having all corners bevelled; two angled-off spring sheetmetal members each having slots therein to support the corners; and flaps bent out of the ends of each of the slots to engage the bevelled corners to hold the crystal in the slots.

Accordingly, unlike in the conventional arrangements, the corners of the crystal vibrator are not supported in the slots of the spring sheetmetal members themselves, but are supported by resilient flaps bent out of the spring members, so that the thus obtained holder corresponds to a multiple spring mounting. There is not only provided the lateral spring action of the spring sheetmetal members and the additional spring action acting in the vertical direction, as is the case with angled-off spring sheetmetal members, but in addition thereto there is still obtained the diagonally acting spring mounting effected by the bent-out flaps. Since these bent-out flaps are attached to the spring sheetmetal members there will result an arrangement of two spring elements connected in series. Since, on the other hand, the bent-out flaps are substantially shorter than the spring sheetmetal members themselves, these two spring elements are of different springiness, and by this it is possible to absorb shocks and vibrations at most frequencies.

According to an advantageous further embodiment of the idea of the invention, there are used two slotted spring sheetmetal members from which two flaps each are bent out on opposite sides of the sheetmetal member.

It is of advantage to connect the flaps to the crystal vibrator by using an elastic bonding material. This material is preferably inserted through a hole or an opening provided for in the flaps, so as to come into contact at this point with the edge of the crystal vibrator.

This elastic material may also be electrically conductive, and may establish in the manner known per se, an electrical connection between the electrodes and the holding pins of the spring sheetmetal members. For this purpose, and in the manner known per se, strip-like metallizations extend from the electrodes up into one corner.

For achieving a good electrical contact it is proposed, according to the invention, to let these strip-like electrode lead-in conductors preferably extend over the bevelled edge of the crystal vibrator.

As the standard frequency generator for electric clocks there are mostly used crystal vibrators of which one or both of the large surfaces are arched. To prevent such crystal vibrators from meeting against the rim portions of the slots, it is proposed, in accordance with a further advantageous embodiment of the invention, that the slots have widths larger than those of the bent-out flaps.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1:
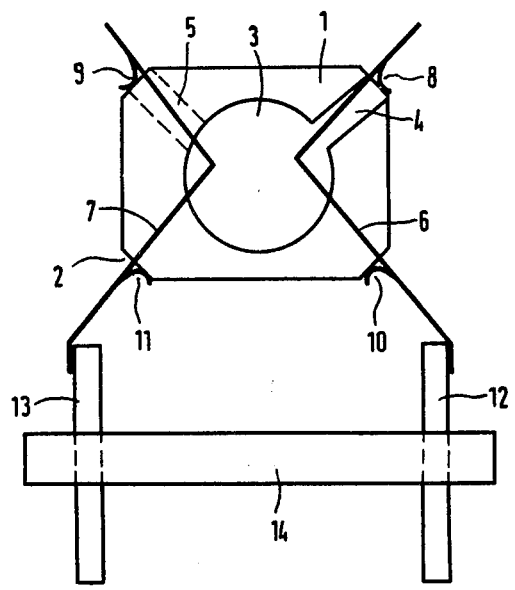
FIG. 1 shows the front view of a piezoelectric crystal holder according to the principles of the present invention.

The piezoelectric crystal holder as shown in FIG. 1 consists of a rectangular crystal vibrator 1 whose four corners are bevelled as indicated by the reference numeral 2. To the front side there is attached an electrode 3 in the form of a metal layer coating, with an electrode of similar form being arranged on the rear side. The electrodes are provided with strip-like lead-in conductors, i.e. the electrode 3 as arranged on the front side, has a strip-like conductor 4 while the electrode on the rear side is provided with a strip-like conductor 5, each extending to one corner of the crystal vibrator. The holder of the crystal vibrator 1 consists of two angled-off spring sheetmetal members 6 and 7 each having a slot in the middle thereof, out of which there are bent the flaps 8 and 10 or 9 and 11, respectively. These bent-out flaps are so arranged that the crystal vibrator 1 can be mounted between them with its bevelled corners 2. The two spring sheetmetal members 6 and 7 are electrically conductive and connected with their ends to the metal pins 12 and 13 which, in turn, are mounted in a base plate 14 in an insulated fashion. This base plate 14 may be the bottom of a container for housing the piezoelectric crystal holder.

Figure 2:
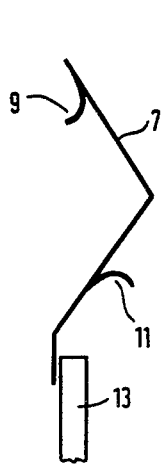
FIG. 2 shows a side view of a spring sheetmetal member used according to the principles of the present invention.
Figure 3:
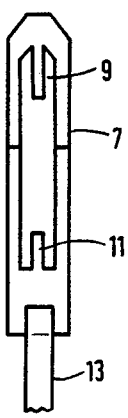
FIG. 3 shows a front view of the same spring sheetmetal member.

FIGS. 2 and 3 show a side view and a front view of the spring sheetmetal member 7, respectively. As may be seen from FIG. 2, the two strip-shaped flaps 9 and 11 are bent out on opposite sides of the angled-off spring sheetmetal member 7. From FIG. 3 it may be taken that the width of the slot in the spring sheetmetal member 7 is larger than the widths of the bent-out strip-shaped flaps 9 and 11.

Figure 4:
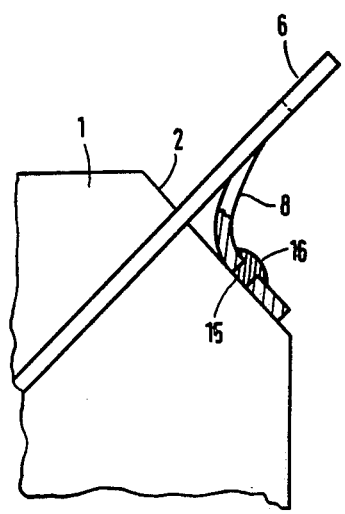
FIG. 4 on an enlarged scale, shows one corner of the piezoelectric crystal holder according to the principles of the present invention.

FIG. 4 shows one corner of the crystal vibrator 1 with its mounting arrangement, on an enlarged scale. The crystal vibrator 1 is in such a way inserted with its bevelled corner 2 through the slot in the spring sheetmetal member 6, that the strip-like flap 8 as bent out of the slot will come to lie on the bevelled edge 2. This bent-out flap has a hole 15 through which the elastic material 16 is in contact with the crystal vibrator 1. This elastic material 16 may at the same time be electrically well conductive so as to establish an electrical contact between the spring sheetmetal member 6 and the strip-like lead-in conductor 4.

Relative thereto, it is of particular advantage for the strip-like lead-in conductor 4 still to extend to the bevel 2 at the edge of the crystal vibrator 1.

Such a piezoelectric crystal holder is particularly suitable for the shock- and vibration-resistant suspension of crystal vibrators within the frequency range beyond 800 kHz used, for example, as frequency-determining elements in electric clocks.

While I have described above the principles of my invention in connection with specific apparatus it is to be clearly understood that this description is made only by way of example and not as a limitation to the scope of my invention as set forth in the objects thereof and in the accompanying claims.

I claim:

1. A piezoelectric crystal holder for a rectangular crystal vibrator coated on both sides with electrodes comprising:
    said crystal having all corners bevelled;
    two angled-off spring sheetmetal members each having slots therein to support said corners; and
    flaps bent out of the ends of each of said slots to engage said bevelled corners to hold said crystal in said slots.
2. A holder according to claim 1, wherein
    said flaps in each of said slots are bent out at the ends of said slots in each of said spring members on opposite sides of each of said spring members.
3. A holder according to claim 2, wherein
    at least two of said flaps are connected to said crystal by an elastic material.
4. A holder according to claim 1, wherein
    at least two of said flaps are connected to said crystal by an elastic material.
5. A holder according to claim 4, wherein
    each of said flaps have a hole with said elastic material disposed in said holes.
6. A holder according to claim 1, wherein
    each of said electrodes have a conductor extending therefrom to a selected one of said bevelled corners.
7. A holder according to claim 1, wherein
    said slots have a width larger than the width of said flaps.

* * * * *